(12) United States Patent
Bramnik

(10) Patent No.: US 10,819,343 B2
(45) Date of Patent: Oct. 27, 2020

(54) FLIP-FLOP WITH SOFT ERROR TOLERANCE

(71) Applicant: Intel Corporation, Santa Clara, CA (US)

(72) Inventor: Arkady Bramnik, Kiryat Motzkin (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/254,452

(22) Filed: Jan. 22, 2019

(65) Prior Publication Data

US 2020/0235736 A1 Jul. 23, 2020

(51) Int. Cl.
*H03K 19/003* (2006.01)
*H03K 19/20* (2006.01)
*H03K 3/037* (2006.01)

(52) U.S. Cl.
CPC ..... *H03K 19/00338* (2013.01); *H03K 3/0372* (2013.01); *H03K 19/20* (2013.01)

(58) Field of Classification Search
CPC . H03K 19/00338; H03K 3/0372; H03K 19/20
See application file for complete search history.

(56) References Cited

U.S. PATENT DOCUMENTS

| 6,624,677 | B1 * | 9/2003 | Wissel | H03K 3/0372 327/202 |
| 7,348,804 | B2 * | 3/2008 | Hoberman | G11C 5/14 326/82 |
| 8,365,049 | B2 * | 1/2013 | Pribbernow | H03K 3/0375 714/780 |
| 8,493,120 | B2 * | 7/2013 | Choudhury | G11C 11/4125 327/203 |
| 9,768,757 | B1 * | 9/2017 | Gaspard | H03K 3/0375 |
| 2010/0153824 | A1 * | 6/2010 | Pribbernow | G06F 11/1008 714/780 |
| 2012/0139578 | A1 * | 6/2012 | Lavery | H03K 3/0375 326/12 |
| 2014/0049286 | A1 * | 2/2014 | Clark | H03K 19/0033 326/16 |

OTHER PUBLICATIONS

Bramnik, A. et al., "Timing Vulnerability Factors of Sequential Elements in Modern Microprocessors", IEEE 19th International On-Line Testing Symposium (IOLTS); Jul. 8-10, 2013 ; DOI: 10.1109/IOLTS.2013.6604051. 6 pages.
Seifert, N. et al., "On the radiation-induced soft error performance of hardened sequential elements in advanced bulk CMOS technologies", International Reliability Physics Symposium; May 2-6, 2010, DOI 10.1109/IRPS.2010.5488831, 10 pages.
Seifert, N. et al., "Soft error susceptibilities of 22 nm Tri-Gate devices", IEEE Transactions on Nuclear Science, vol. 59, Iss. 6; Oct. 23, 2012; pp. 2666-2673.
Seifert, N. et al., "Timing Vulnerability Factors of Sequentials", Transactions on Device and Materials Reliability, vol. 4, No. 3; Sep. 2004; pp. 516-522.

* cited by examiner

*Primary Examiner* — Daniel D Chang
(74) *Attorney, Agent, or Firm* — Green, Howard & Mughal LLP

(57) ABSTRACT

Described is soft error tolerant flip-flop which comprises hardened sequential elements to reduce latch soft error rate. The flip-flop may include a master latch; and a slave latch coupled to the master latch, wherein only one of the master or slave latch of the flip-flop comprises hardened latch circuitry. For example, only the master latch comprises the hardened latch circuitry.

24 Claims, 9 Drawing Sheets

FLIP-FLOP WITH SOFT ERROR TOLERANCE

BACKGROUND

Ionizing radiation causes noise bursts in silicon substrates of modern integrated circuits (ICs). If the amount of charge collected at reverse-biased junctions is larger than a critical charge, an upset occurs. Due to the relatively low flux rates in the radiation environments of interest, single particles induce faults. In memory type cells, radiation-induced faults are single event upsets which are stable in time until the upset devices are re-written. Single event transients that occur in static combinational logic, where the node voltage is always restored in the case of a particle strike, form another class of radiation-induced faults. More than 95% of all upsets at sea-level are either due to high energy neutrons or alpha particles emitted from radioactive isotopes located within a short distance (e.g., 50 µm) of an active silicon surface. In contrast, soft error upsets in a space environment mainly result from protons trapped in belts by earth's magnetosphere in the case of low earth orbits, and heavy ions in geosynchronous orbits.

Soft Error Rate (SER) is a significant feature of many electronic devices. It is critical for servers and in functional safety applications including usage in automotive, aviation, robotics and other. SER of sequential elements is a significant part of total device SER. The existing memory array SER reduction techniques like error correction code (ECC) or parity protection are not applicable for sequential elements.

The background description provided herein is for generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
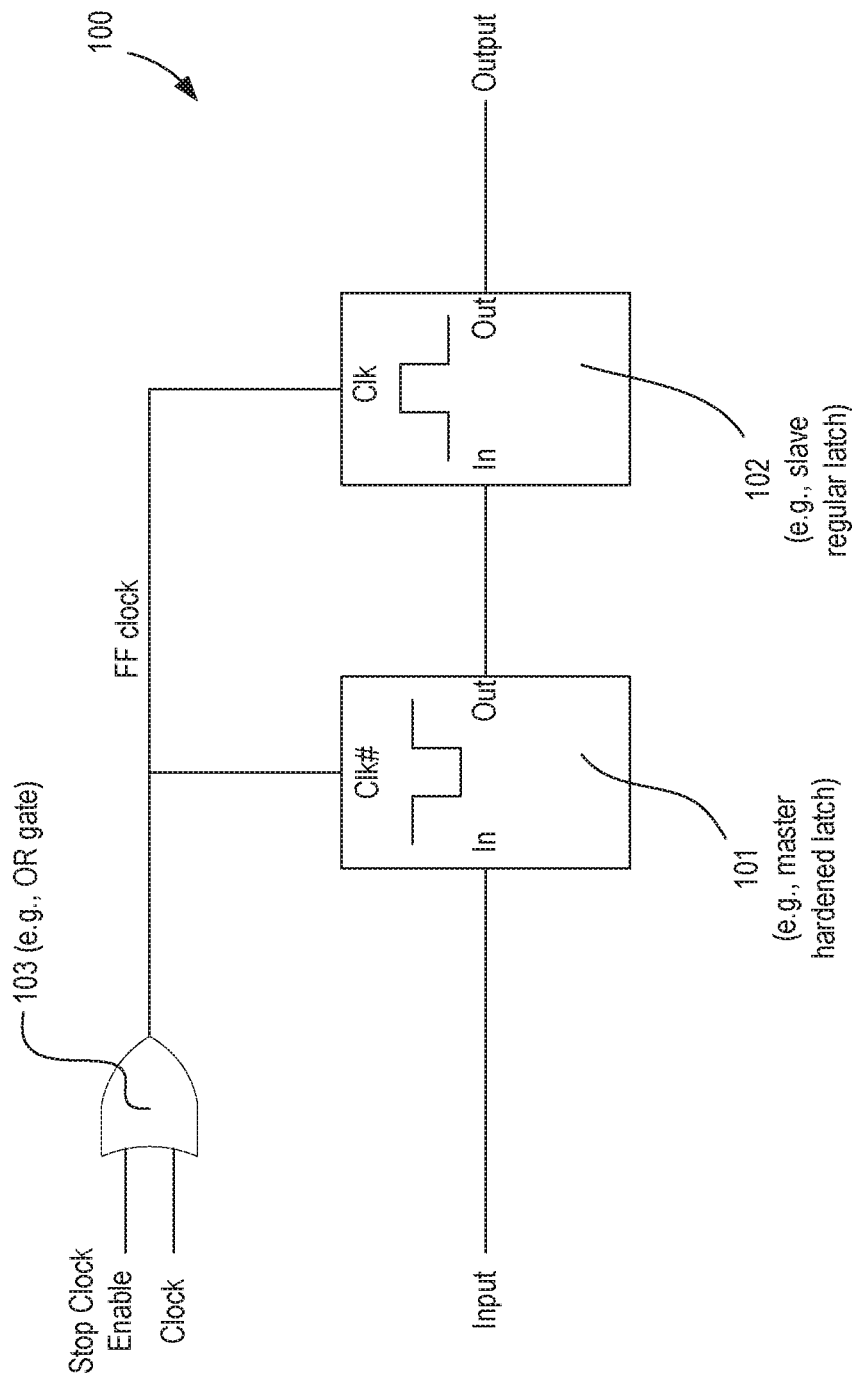
FIG. 1 illustrates a hardened flip-flop (FF) that operates on a rising clock edge, in accordance with some embodiments.

One way to reduce SER in memory array is to use parity and error correcting code (ECC) protection schemes. However, these schemes are generally not employed beyond memory arrays while sequential elements such as latches and flip-flops are used as basic logic elements outside of memory arrays. SER can be reduced for such sequential elements using hardened sequential elements (e.g., latches and flip-flops (FF)). Known hardened sequential elements lead to high penalties in area, power and timing (can be translated to area and power penalties). In many cases, power, timing, and area penalties as a result of hardened sequential element usage are significant and there exists conflict between high level SER protection and power, timing, and area penalties. A hardened Flip-Flop (FF) contains hardened latches for both master and slave latches to achieve significant SER protection level.

Hardened sequential elements reduce latch SER. Higher SER protection level generally uses more hardware resources. For example, the latch with the highest protection level such as SEUT (Single Event Upset Tolerant) latch requires 2× area, active and leakage power than regular latch. In addition, SEUT latch has bigger setup time ($T_{setup}$), clock-to-output ($T_{CO}$), and transparency delays. Traditional implementation of hardened FF requires the use of hardened latches for both master and slave latches. One reason for that is that master and slave latches are serially coupled and generally considered as an integrated unit of a flip-flop.

Generally, SER contribution of master latch is higher than that of a slave latch. One reason for SER contribution of the slave latch being lower than the master latch is that the slave latch drives an external driver whose capacitance is higher than the internal load driven by the master latch. As such, the recycle node capacitance of a slave latch is higher than that of a master latch, and that leads to the slave latch having lower SER compared to the SER of the master latch. For example, SER in slave latch leads to 20% to 40% lower SER compared to SER in master latch.

It is known that any latch is in transparent phase or mode during one clock phase, and stores the data during another clock phase. The output of any latch is connected to the input of another latch with an opposite clock scheme through combinational logic. But data stored by the latch is not vulnerable during part of the storing clock phase. The same clock edge opens a certain latch (e.g., moves it from data store mode to transparent mode) and closes the next downstream latch (e.g., moves it from transparent mode to data store mode). If data stored by a certain latch is corrupted close to the end of the store phase or mode, the corrupted data can achieve the input of the next downstream latch after its closing. Thus, there is a non-vulnerable zone at the end of the latch store data phase or mode. If data is corrupted at this time, the latch output data change will achieve input for the next downstream latch after its closing. The duration of this non-vulnerable zone depends on the delay between a certain latch output and the input of the next downstream latch.

As such, the vulnerability of data kept by a slave latch of a FF depends on the delay between FFs. If this delay is more than a clock phase, the data kept by a slave latch may not be vulnerable during all its store phases. If FF-to-FF delay is more than a clock phase, than a master latch non-vulnerable zone may also be created. In one example, data stored by master latch and slave latch of a FF is vulnerable 40% and 10% of clock cycle time in average, respectively. In this example, the master latch contributes approximately 84% of the total sequential SER.

In some embodiments, hardened FFs are described that achieve high levels of SER protection using hardened latch in only one of master or slave latches. As such, the same level or substantially the same level of SER protection is achieved for various embodiments compared to when hardened latches for both master and slave latches are used. By implementing a hardened latch for one of the master or slave latches, lower power, timing, and area penalties are realized while achieving a high level of SER. Other technical effects will be evident from the various embodiments and figures.

While various embodiments here use hardened latch for the master latch and use regular latch for implementing the slave latch, the other way is possible too. For example, in some cases a slave latch may contribute higher SER than a master latch due to, for instance, larger sized devices in the master latch and smaller sized devices in the slave latch. Other reasons are also possible for such asymmetry in the SER level between the master and slave latches. SER of the slave latch can be higher than the SER of the master latch if the activity factor of the flip-flop is low and the most time the slave latch stores the data. In such a case, the slave latch may be implemented as a hardened latch while the master latch may be implemented as a regular latch.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a hardened flip-flop (FF) 100 that operates on a rising clock edge, in accordance with some embodiments. Sequential element SER is a significant part from the total product SER. There is a tradeoff between SER reduction on the one side and area increasing and performance reduction as a result of power and timing penalties on the other side. FF 100 achieves substantially similar SER protection with lower area, power and timing penalties compared to a FF which has both master and slave latches implemented as hardened latches. FF 100 is an example of a sequential element, which comprises a master latch 101, slave latch 102, and OR gate 103, where master latch 101 is implemented as a hardened latch while slave latch 102 is implemented as a regular latch. Here, master latch 101 transfers data from its input to output at a low phase of a clock, and stores the data at a high phase of the clock. In this example, slave latch 103 transfers data from its input to its output at a high phase of the clock and stores the data at a low phase of the clock.

The inputs of FF 100 are Stop Clock Enable, Clock, data Input, and data Output. Here, FF clock is the internal clock generated by the OR function of inputs Stop Clock Enable and Clock. In some embodiments, OR gate 103 is shared by multiple FFs and may be implemented outside the FF cell boundary. In one such case, the clock input to FF 100 is FF clock instead of Stop Clock Enable and Clock.

Examples of a hardened latch 101 are illustrated with reference to FIGS. 5-6. A regular latch comprises a pass-gate followed by a cross-coupled inverting stage (e.g., a memory element). Referring back to FIG. 1, in various embodiments, stop clock mode is implemented for the clock phase used to store data by master latch 101. In this mode, the slave latch 102 is in transparent mode. Here, using merely one hardened latch (e.g., in master latch 101) reduces SER in FF 100 for both sequential and stop clock modes. When FF 100 operates on rising clock edge, it generally means that stop clock mode is implemented at high clock phase. Later as discussed with reference to FIG. 3, a FF may operate on a falling clock edge in which stop clock mode is implemented in low clock phase.

Figure 2:
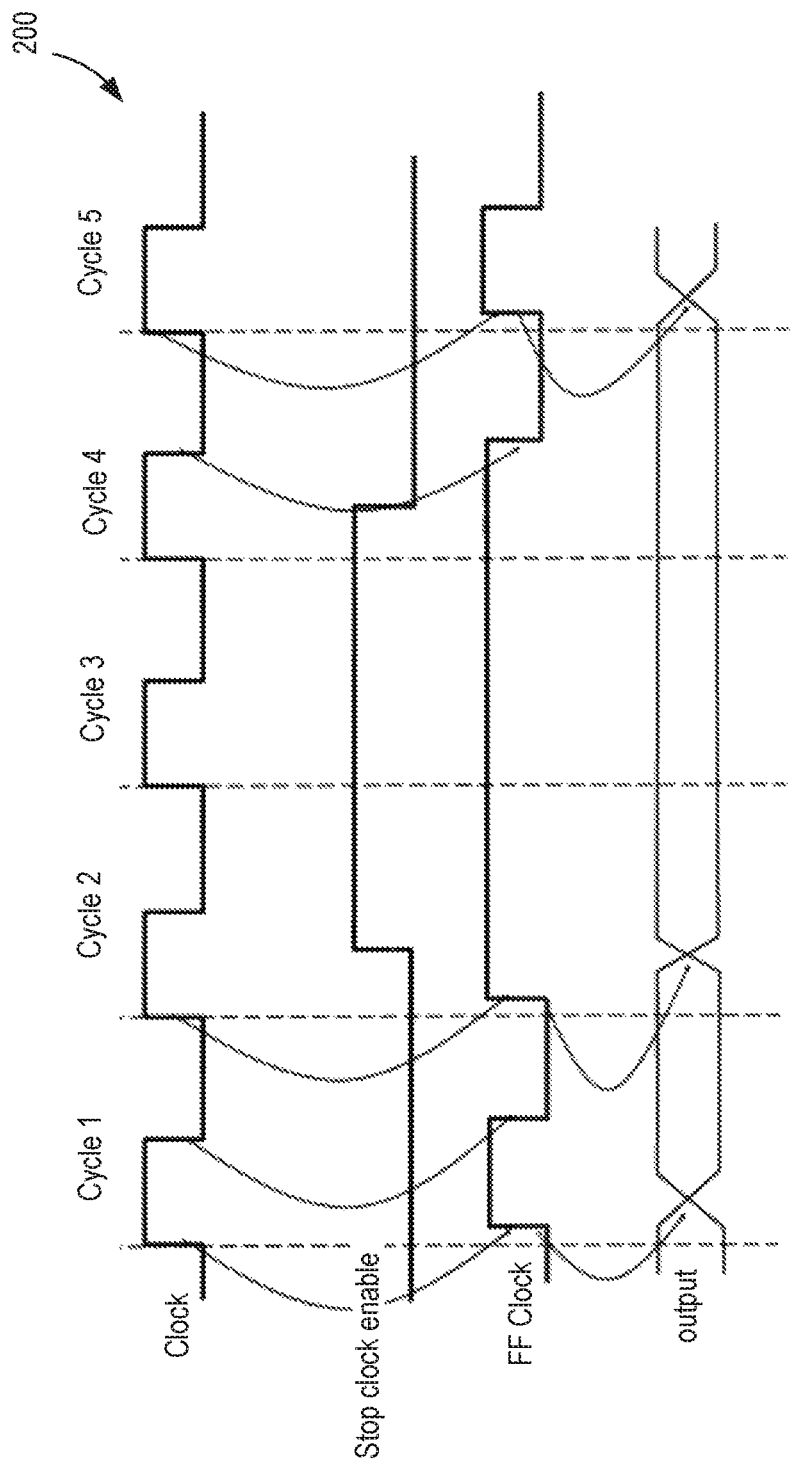
FIG. 2 illustrates a timing diagram of the hardened FF of FIG. 1, in accordance with some embodiments.

FIG. 2 illustrates a timing diagram 200 of the hardened FF of FIG. 1, in accordance with some embodiments. Here, x-axis is time and y-axis is logic level. Rising edge FF 100 comprises master latch 101 that transfers data from its input to its output at a low phase of the clock and stores the data at a high phase of the clock. Rising edge FF 100 comprises slave latch 102 that transfers data from its input to output at a high phase of the clock and stores the data at a low phase of the clock. In this example, the stop clock mode is implemented at high clock phase during clock cycles 3 and 4. On the rising edges of clock cycles 1 and 2, FF 100 works as usual in that the data of FF input is transferred to its output at the clock rising edge. FF stop clock begins at clock cycle 2 (e.g., FF clock may not go down at clock cycle 2) and continues until clock cycle 4. At clock cycle 4, the FF clock has up-down transition (e.g., the end of stop clock mode). In this example, the behavior of FF 100 is usual or normal from clock cycle 5 and onwards.

Figure 3:
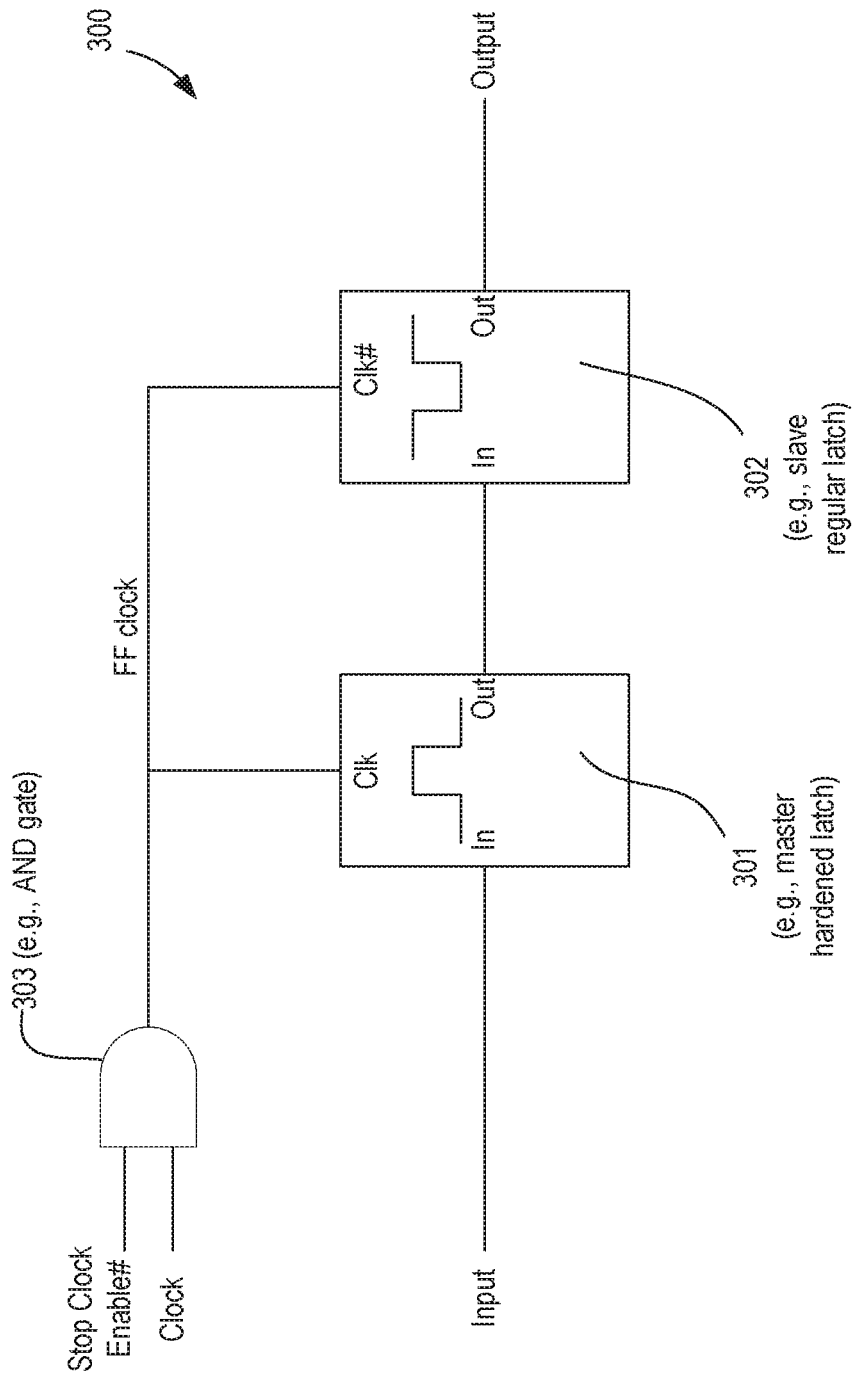
FIG. 3 illustrates a hardened FF that operates on a falling clock edge, in accordance with some embodiments.

FIG. 3 illustrates a hardened FF 300 that operates on a falling clock edge, in accordance with some embodiments. FF 300 achieves substantially similar SER protection with lower area, power and timing penalties compared to a FF which has both master and slave latches implemented as hardened latches. FF 300 is an example of a sequential element which comprises a master latch 301, slave latch 302, and an AND gate 303, where master latch 301 is implemented as a hardened latch while the slave latch is implemented as a regular latch. Master latch 301 transfers data from its input to its output at a high phase of the clock and stores data at a low phase of the clock. Slave latch 302 transfers data from its input to its output at a low phase of the clock and stores the data at a high phase of the clock.

The inputs of FF 300 are Stop Clock Enable # (e.g., inverse of Stop Clock Enable), Clock, data Input, and data Output. Here, the FF clock is the internal clock generated by the AND function of inputs Stop Clock Enable # and Clock. In some embodiments, AND gate 303 is shared by multiple FFs and may be implemented outside the FF cell boundary. In one such case, the clock input to FF 300 is FF clock instead of Stop Clock Enable # and Clock.

Figure 4:
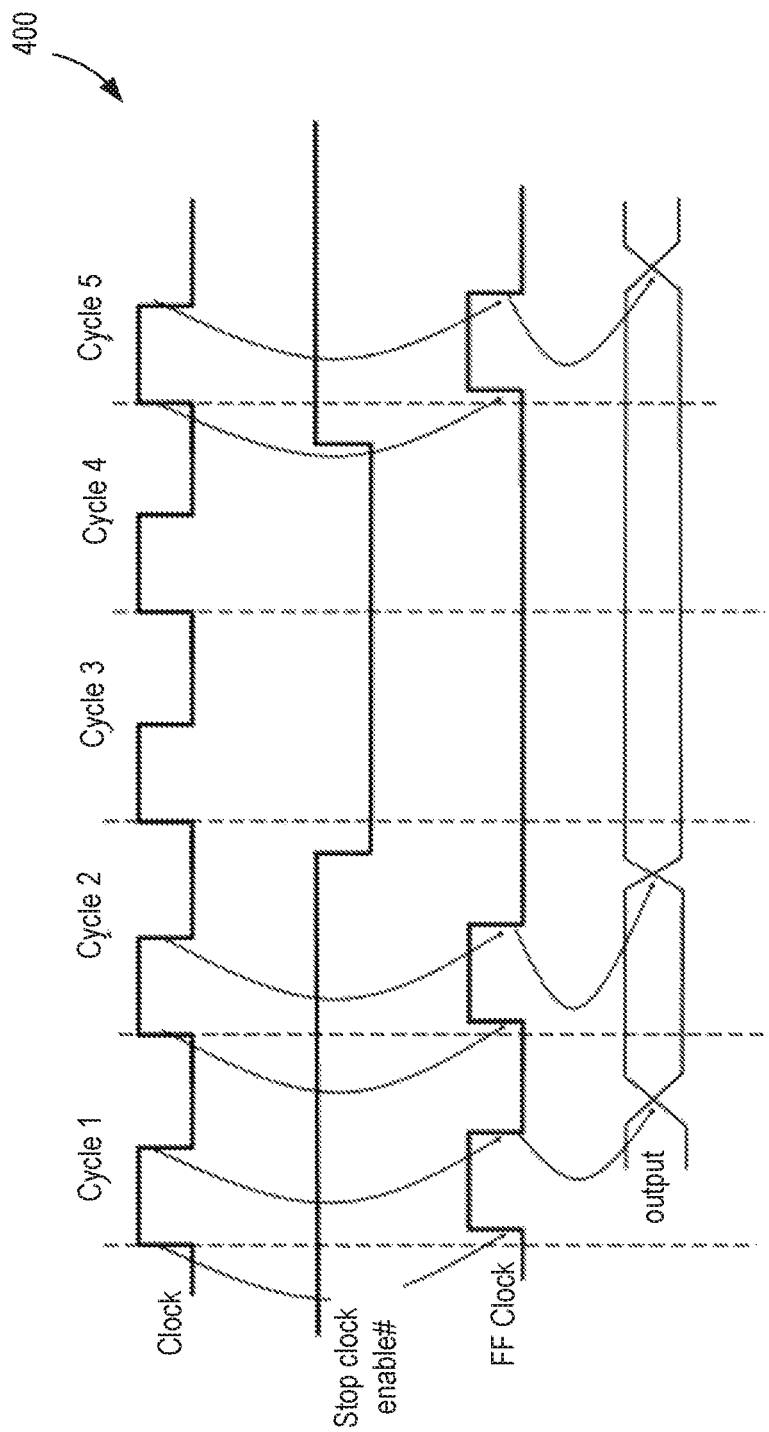
FIG. 4 illustrates a timing diagram of the hardened FF of FIG. 2, in accordance with some embodiments.

FIG. 4 illustrates timing diagram 400 of the hardened FF of FIG. 2, in accordance with some embodiments. Here, x-axis is time and y-axis is logic level. Rising edge FF master latch 301 that transfers data from its input to its output at a high phase of the clock and stores the data at a low phase of the clock. Slave latch 302 transfers data from its input to output at a low phase of the clock and stores the data at a high phase of the clock.

In this example, the stop clock mode is implemented at low clock phase during clock cycles 3 and 4. On the falling edges of clock cycles 1 and 2, FF 300 works as usual in that the data of FF input is transferred to its output at clock rising edge. FF stop clock begins at clock cycle 2 (e.g., FF clock may not go down at clock cycle 2) and continues until clock cycle 4. At clock cycle 4, the FF clock has up-down transition (e.g., the end of stop clock mode). In this example, the behavior of FF 300 is usual or normal from clock cycle 5 and onwards.

Figure 5:
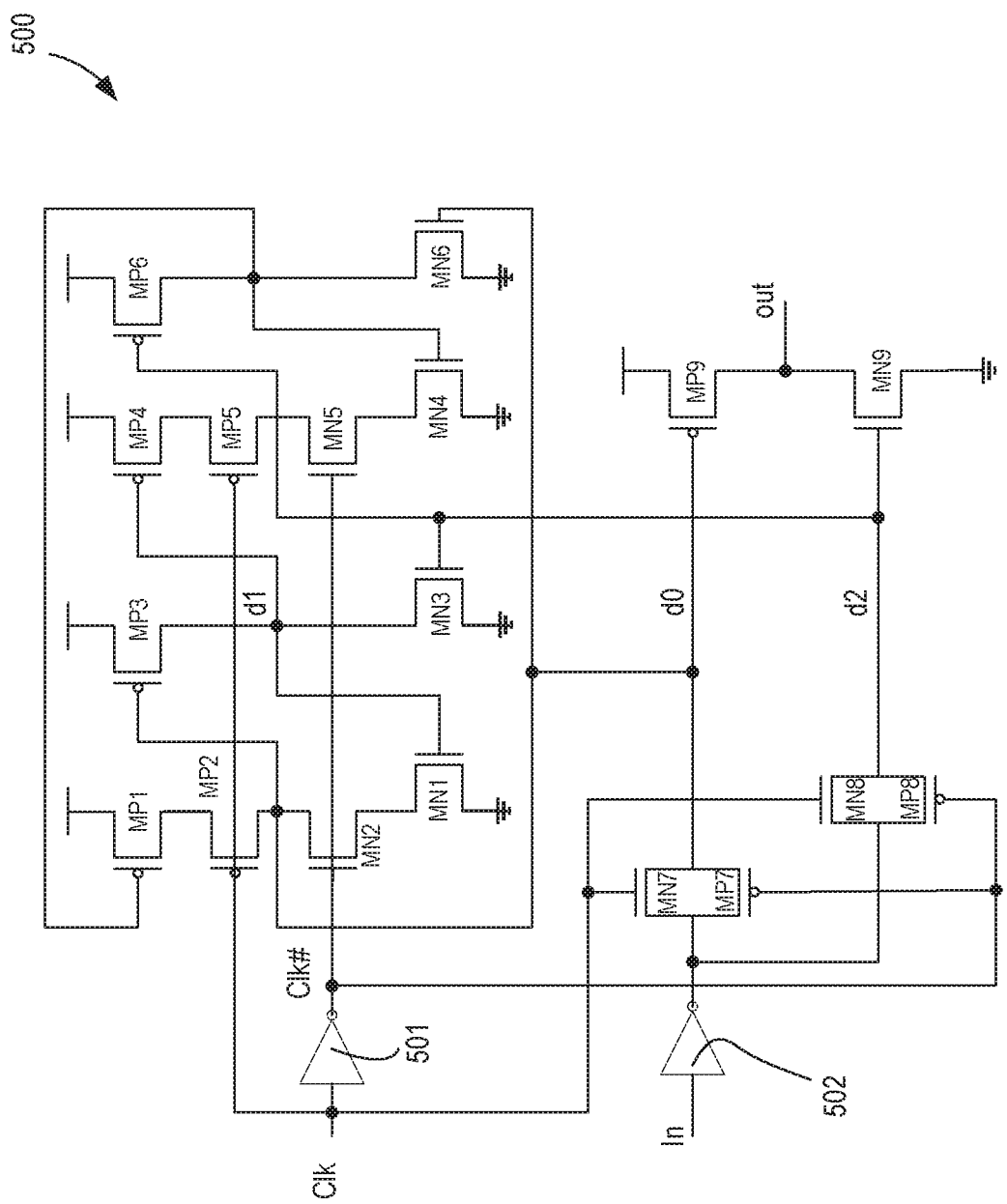
FIG. 5 illustrates a schematic of a hardened latch for use in the hardened FF, in accordance with some embodiments.

FIG. 5 illustrates a schematic 500 of a hardened latch for use in the hardened FF, in accordance with some embodiments. Schematic 500 comprises inverters 501 and 502, p-type transistors MP1, MP2, MP3, MP4, MP5, MP6, MP7, MP8, and MP9; n-type transistors MN1 MN2, MN3, MN4, MN5, MN6, MN7, MN8, and MN9; and nodes Clk (e.g., FF clock), In (e.g., input), do, d1, d2, and out (e.g., output) coupled together as shown. One main difference between a regular latch having cross-coupled inverting devices as the non-hardened memory element and the hardened latch is the storage cell. In the hardened latch 500, a fully interrupted SET circuit is implemented that features redundant data signals d0 and d2 to reduce the overall SET of the latch. During normal write operation, clock Clk is high and input pass gates (where one pass-gate comprises transistors MN7, MP7 and the other pass-gate comprises transistors MN8, MP8) are on. The transistors controlled by clock inputs to SEUT are off. Data is written into SEUT inputs d0 and d2, which controls transistors MP3, MN3, MP6, and MN6, setting states d1 and d3 correctly. Another option to reduce SET in a latch is to protect clock nodes by implementing redundant clocks, for example.

Figure 6:
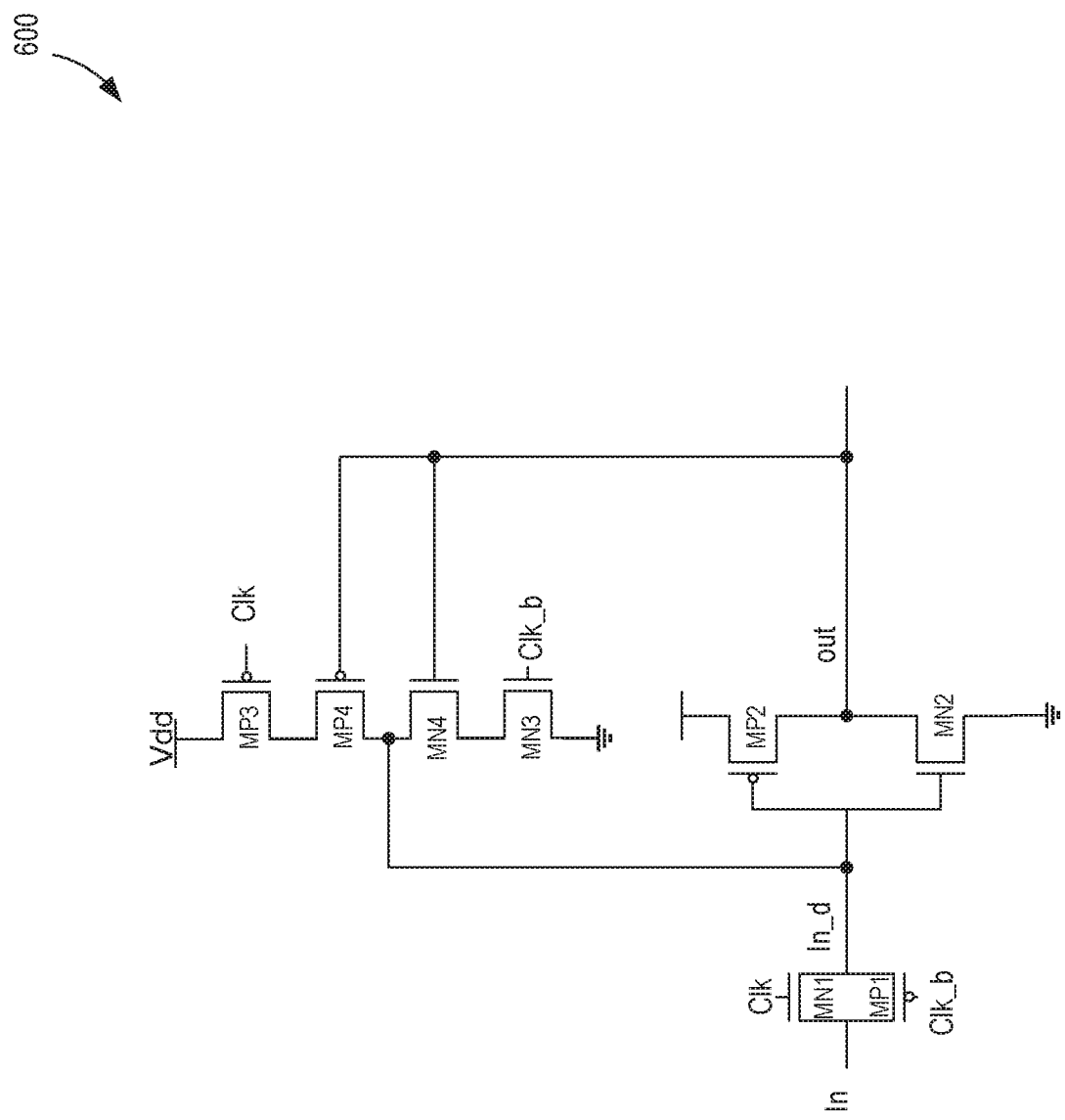
FIG. 6 illustrates a schematic of a hardened latch for use in the hardened FF, in accordance with some embodiments.

FIG. 6 illustrates a schematic 600 of a hardened latch for use in the hardened FF, in accordance with some embodiments. Schematic 600 comprises pass-gate (e.g., n-type transistor MN1 coupled to p-type transistor MP1), first inverter (e.g., having p-type transistor MP2 and n-type transistor MN2), and second inverter (e.g., having p-type transistors MP3 and MN3, and n-type transistors MN3 and MP3) and nodes In, In_d, out, Clk, and Clk_b coupled as shown. Clocks Clk and Clk_b also control the second inverter, where clock Clk_b is an inverse of clock Clk. Compared to traditional clock controlled inverters used in latches, here the transistors that are closest to supply rails (e.g., Vdd or Ground) are controlled by clock signals.

For example, transistor MP3 that is coupled to supply Vdd is controlled by Clk which is received at its gate terminal. Likewise, transistor MN3 that is coupled to ground is controlled by Clk_b which is received at its gate terminal. The output of the second inverter is coupled to the input node In_d, and this output has a lower SER compared to a traditional latch configuration in which the second inverter has clock-controlled transistors MP4 and MN3. As such, the output out has lower SER compared to a transitional latch configuration.

Figure 7:
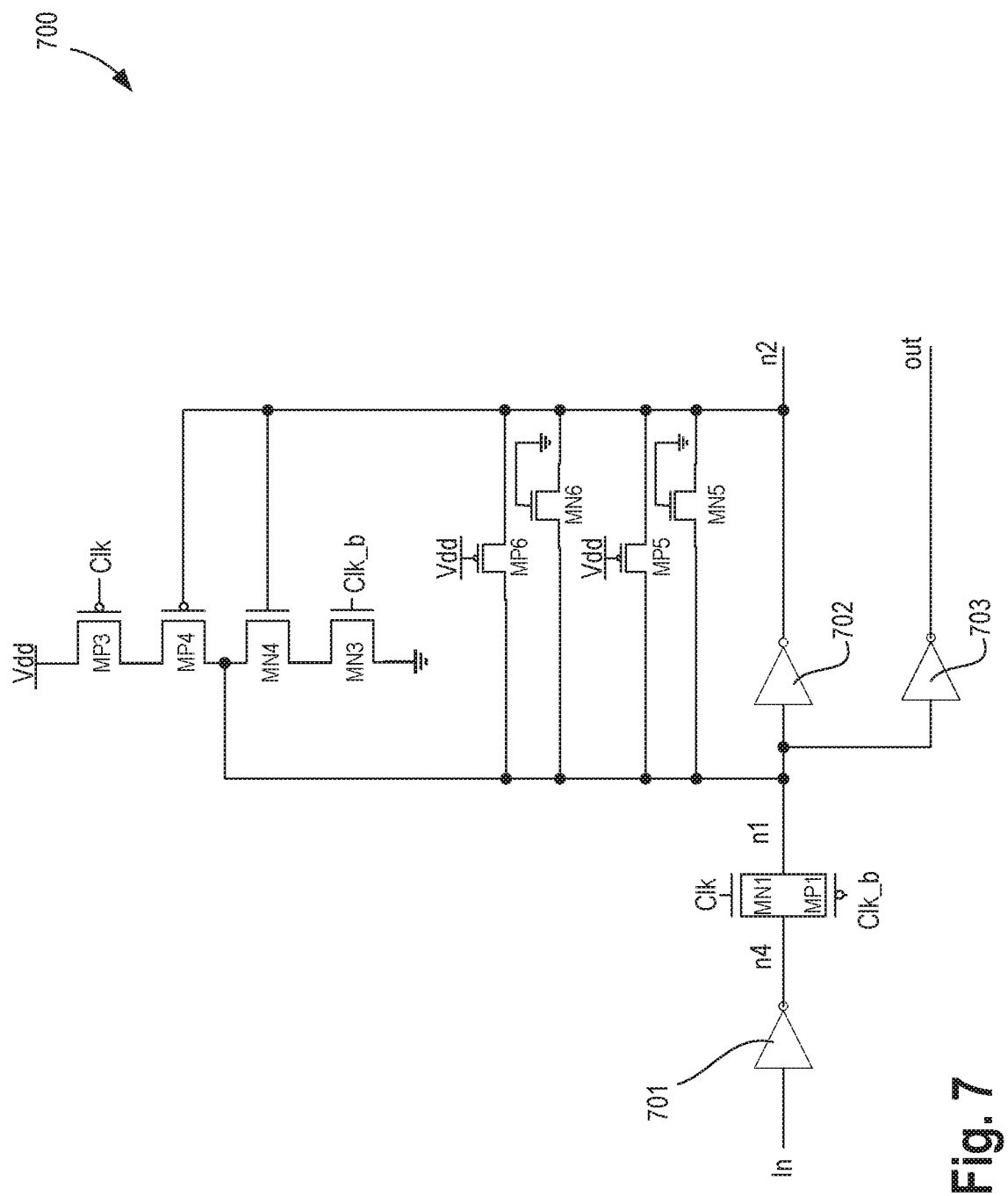
FIG. 7 illustrates a schematic of a reinforcing charge collection (RCC) hardened latch for use in the hardened FF, in accordance with some embodiments.

FIG. 7 illustrates a schematic 700 of a reinforcing charge collection (RCC) hardened latch for use in the hardened FF, in accordance with some embodiments. Schematic 700 comprises: pass-gate (e.g., n-type transistor MN1 coupled to p-type transistor MP1); first inverter 701; second inverter 702; third inverter 703, nodes In, out, n1, n2, n4, Clk, Clk_b, Vdd, and ground; clock controlled inverter comprising p-type transistors MP3, MP4, n-type transistors MN3, and MN4, p-type pass-gates MP5 and MP6; and n-type pass-gates MN5 and MN6 coupled together as shown. Clocks Clk and Clk_b control the pass-gate between nodes n1 and n4, and also control the inverter enabled by the clocks, where clock Clk_b is an inverse of clock Clk. Compared to traditional clock controlled inverters used in latches, here the transistors that are closest to supply rails (e.g., Vdd or Ground) are controlled by clock signals.

Latch 700 comprises of a pair of cross-coupled inverters (e.g., 702 and clock controlled inverter). In each inverter, the diffusion of the off device is vulnerable to collecting ionizing-particle-induced charge that can disrupt the stored state. The diffusion of the on device collects charge that reinforces the stored state. If the charge generated by a particle strike is collected in both the diffusions (of the Off and On devices) by charge sharing, the critical charge to upset the stored state is increased which reduces SER. In this example, the diffusion of the On device is fully reverse biased. As such, the diffusion of the On device is an efficient collector of the particle-induced charge.

Hardened latches 500, 600, and 700 transfer data from input to output at clock high phase and store the data at clock low phase. Such latches can be used as a slaves latch for a rising edge FF and a master latch for falling edge FF. An additional inverter may be used on the clock input transfer data between the latches. For example, an additional inverter on the clock input path may be used to transfer data from the input to the output at a clock low phase and to store the data at a clock high phase. After this change, the hardened latches can be used as a master latch for the rising edge FF, and can be used as a slave latch for a falling edge FF.

Figure 8:
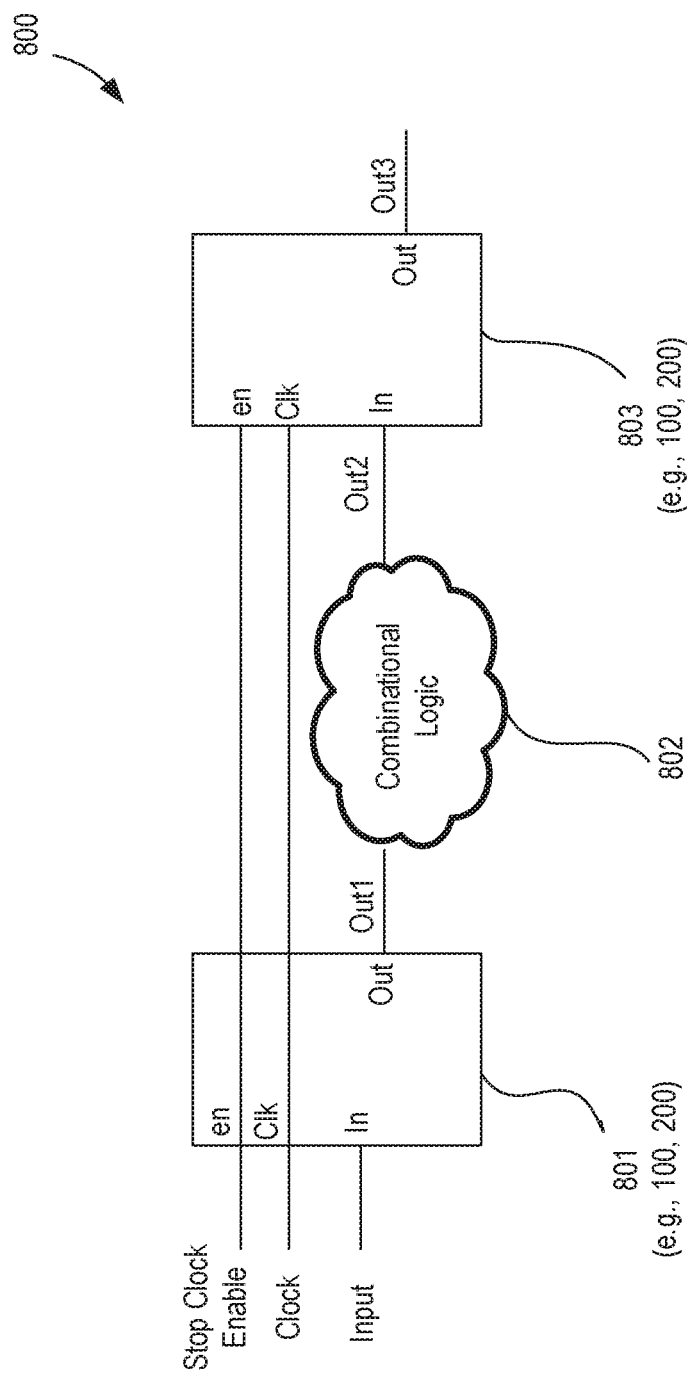
FIG. 8 illustrates a pipeline with hardened FFs and combinational logic between then, in accordance with some embodiments.

FIG. 8 illustrates a pipeline 800 with hardened FFs and combinational logic between them, in accordance with some embodiments. In pipeline 800, two FFs 801 and 803 are shown with combinational logic 802 between them. In some embodiments, one or both FFs 801 and 802 are hardened FFs (e.g., one of 100 or 200). The output of FF 801 is Out1, which is received as input by combinational logic 802. One of the outputs of combinational logic 702 is Out2, which is received by the input In of FF 803. The output of FF 803 is Out3, which can be received by another combinational logic or sequential logic. While the two FFs 801 and 803 are illustrated as FFs that operate on rising clock edges, the two FFs 801 and 803 can be falling edge triggered FFs too. In some embodiments, FF 801 is a rising edge triggered hardened FF while FF 803 is falling edge triggered FF.

Figure 9:
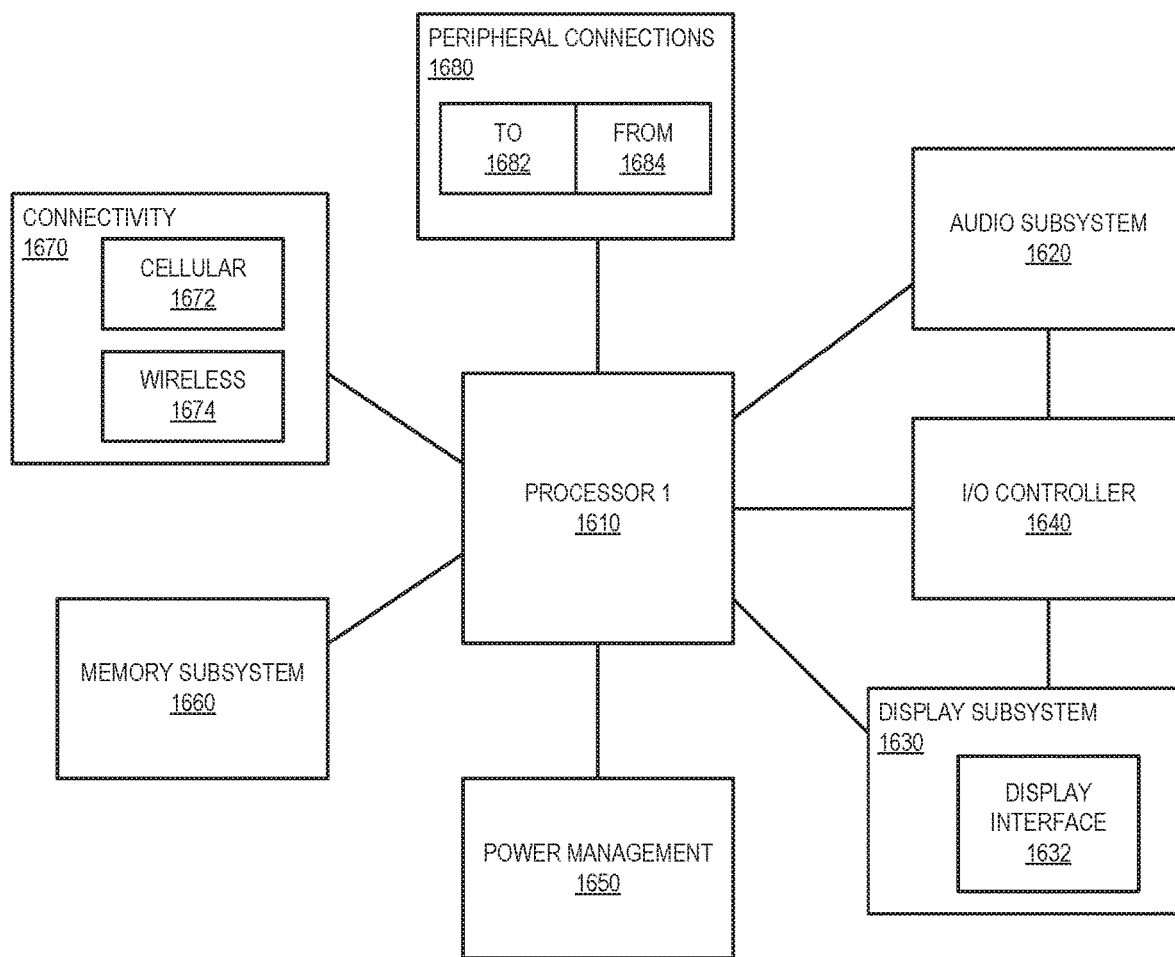
FIG. 9 illustrates a smart device, a computer system, or a SoC (System-on-Chip) with one or more hardened FFs, according to some embodiments of the disclosure.

FIG. 9 illustrates a smart device, a computer system, or a SoC (System-on-Chip) with one or more hardened FFs, according to some embodiments of the disclosure. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It is understood that certain components are shown generally, and not all components of such a device are shown in computing device 1600.

In some embodiments, computing device 1600 includes processor 1610 with one or more hardened FFs, according to some embodiments discussed. Other blocks of the computing device 1600 may also include one or more hardened FFs, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

A flip-flop comprising: a master latch; and a slave latch coupled to the master latch, wherein only one of the master or slave latch of the flip-flop comprises hardened latch circuitry.

Example 2

The flip-flop of example 1, wherein the master latch comprises the hardened latch circuitry.

Example 3

The flip-flop of example 1 comprising an OR logic gate coupled to the master and slave latches, wherein the OR logic gate is to receive a clock and a stop clock enable, and wherein an output of the OR logic gate is provided as clock input to the master and slave latches.

Example 4

The flip-flop of example 1 comprising an AND logic gate coupled to the master and slave latches, wherein the AND logic gate is to receive a clock and an inverted stop clock enable, and wherein an output of the AND logic gate is provided as clock input to the master and slave latches.

Example 5

The flip-flop of examples 3 and 4, wherein the master latch is to store input data and the slave latch is to be in transparent operation mode when stop clock enable is activated.

Example 6

The flip-flop of examples 3 and 4, wherein the stop clock enable at least one clock cycle before a transition of the clock.

Example 7

An apparatus comprising: a first flip-flop; a combinational logic coupled to an output of the first flip-flop; and a second flip-flop having a data input coupled to an output of the combinational logic, wherein at least one of the first or second flip-flops comprises a soft error tolerant flip-flop, wherein the soft error tolerant flip-flop comprises a master latch and a slave latch, and wherein the master latch includes a hardened latch circuitry while the slave latch does not include a hardened latch circuitry.

Example 8

The apparatus of example 1, wherein the soft error tolerant flip-flop comprises an OR logic gate coupled to the master and slave latches, wherein the OR logic gate is to receive a clock and a stop clock enable, and wherein an output of the OR logic gate is provided as clock input to the master and slave latches.

Example 9

The apparatus of example 1, wherein the soft error tolerant flip-flop comprises an AND logic gate coupled to the master and slave latches, wherein the AND logic gate is to receive a clock and a stop clock enable, and wherein an output of the AND logic gate is provided as clock input to the master and slave latches.

Example 10

The apparatus of examples 8 and 9, wherein the master latch is to store input data and the slave latch is to be in transparent operation mode when stop clock enable is activated.

Example 11

The apparatus of examples 8 and 9, wherein the stop clock enables at least one clock cycle before a transition of the clock.

Example 12

A system comprising: a memory; a processor coupled to the memory, wherein the processor includes: a first flip-flop; a combinational logic coupled to an output of the first flip-flop; and a second flip-flop having a data input coupled to an output of the combinational logic, wherein at least one of the first or second flip-flops comprises a soft error tolerant flip-flop, wherein the soft error tolerant flip-flop comprises a master latch and a slave latch, and wherein the master latch includes a hardened latch circuitry while the slave latch does not include a hardened latch circuitry; and a wireless interface to allow the processor to communicate with another device.

Example 13

The system of example 12, wherein the soft error tolerant flip-flop comprises an OR logic gate coupled to the master and slave latches, wherein the OR logic gate is to receive a clock and a stop clock enable, and wherein an output of the OR logic gate is provided as clock input to the master and slave latches.

Example 14

The system of example 12, wherein the soft error tolerant flip-flop comprises an AND logic gate coupled to the master and slave latches, wherein the AND logic gate is to receive a clock and a stop clock enable, and wherein an output of the AND logic gate is provided as clock input to the master and slave latches.

Example 15

The system of examples 13 and 14, wherein the master latch is to store input data and the slave latch is to be in transparent operation mode when stop clock enable is activated.

Example 16

The system of examples 13 and 14, wherein the stop clock enables at least one clock cycle before a transition of the clock.

Example 17

An apparatus comprising: a circuitry to gate an input clock, and to provide a gated clock; a master latch to receive the gated clock; and a slave latch coupled to the master latch, wherein the slave latch is to receive the gated clock, and wherein the master latch comprises hardened latch circuitry while the slave latch of the flip-flop does not have a hardened latch circuitry.

Example 18

The apparatus of example 17, wherein the circuitry includes an OR logic gate coupled to the master and slave latches, wherein the OR logic gate is to receive the input clock and a stop clock enable, and wherein an output of the OR logic gate is provided as the gated clock to the master and slave latches.

Example 19

The apparatus of example 17, wherein the circuitry includes an AND logic gate coupled to the master and slave latches, wherein the AND logic gate is to receive the input clock and a stop clock enable, and wherein an output of the AND logic gate is provided as the gated clock to the master and slave latches.

Example 20

The apparatus of example 17, wherein the master latch is to store input data and the slave latch is to be in transparent operation mode when stop clock enable is activated, and wherein the stop clock enables at least one clock cycle before a transition of the clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A flip-flop comprising:
 a master latch; and
 a slave latch coupled to the master latch, wherein only the master latch of the flip-flop comprises a hardened latch circuitry, wherein the hardened latch circuitry comprises:
 an inverter coupled to a first pass-gate, wherein an input of the inverter is coupled to the first pass-gate;
 a tristatable inverter having an input coupled to an output of the inverter, wherein the tristatable inverter includes:
  a first transistor having a source terminal coupled to a power supply node and a gate terminal coupled to a clock input, and
  a second transistor having a source terminal coupled to a ground supply node and a gate terminal coupled to an inverse of the clock input
 a second pass-gate connected to the input and the output of the inverter, wherein the second pass-gate is of first conductivity type; and
 a third pass-gate connected to the input and the output of the inverter, wherein the third pass-gate is of second conductivity type.

2. The flip-flop of claim 1 comprising an OR logic gate coupled to the master and slave latches, wherein the OR logic gate is to receive a clock and a stop clock enable, and wherein an output of the OR logic gate is provided as the clock input to the master and slave latches.

3. The flip-flop of claim 1 comprising an AND logic gate coupled to the master and slave latches, wherein the AND logic gate is to receive a clock and a stop clock enable, and wherein an output of the AND logic gate is provided as the clock input to the master and slave latches.

4. The flip-flop of claim 3, wherein the master latch is to store an input data and the slave latch is to be in transparent operation mode when the stop clock enable is activated.

5. The flip-flop of claim 3, wherein the stop clock enable is at least one clock cycle before a transition of the clock.

6. An apparatus comprising:
 a first flip-flop;
 a combinational logic coupled to an output of the first flip-flop; and
 a second flip-flop having a data input coupled to an output of the combinational logic, wherein at least one of the first or second flip-flops comprises a soft error tolerant flip-flop, wherein the soft error tolerant flip-flop comprises a master latch and a slave latch, and wherein the master latch includes a hardened latch circuitry while the slave latch does not include a hardened latch circuitry, wherein the hardened latch circuitry comprises:
 an inverter coupled to a pass-gate, wherein an input of the inverter is coupled to the pass-gate;
 a tristatable inverter having an input coupled to an output of the inverter, wherein the tristatable inverter includes:
  a first transistor having a source terminal coupled to a power supply node and a gate terminal coupled to a clock input, and
  a second transistor having a source terminal coupled to ground supply node and a gate terminal coupled to an inverse of the clock input;
 a second pass-gate connected to the input and the output of the inverter, wherein the second pass-gate is of first conductivity type; and
 a third pass-gate connected to the input and the output of the inverter, wherein the third pass-gate is of second conductivity type.

7. The apparatus of claim 6, wherein the soft error tolerant flip-flop comprises an OR logic gate coupled to the master and slave latches, wherein the OR logic gate is to receive a clock and a stop clock enable, and wherein an output of the OR logic gate is provided as the clock input to the master and slave latches.

8. The apparatus of claim 6, wherein the soft error tolerant flip-flop comprises an AND logic gate coupled to the master and slave latches, wherein the AND logic gate is to receive a clock and a stop clock enable, and wherein an output of the AND logic gate is provided as the clock input to the master and slave latches.

9. The apparatus of claim 8, wherein the master latch is to store input data and the slave latch is to be in transparent operation mode when the stop clock enable is activated.

10. The apparatus of claim 8, wherein the stop clock enables at least one clock cycle before a transition of the clock.

11. A system comprising:
a memory;
a processor coupled to the memory, wherein the processor includes:
a first flip-flop;
a combinational logic coupled to an output of the first flip-flop; and
a second flip-flop having a data input coupled to an output of the combinational logic, wherein at least one of the first or second flip-flops comprises a soft error tolerant flip-flop, wherein the soft error tolerant flip-flop comprises a master latch and a slave latch, and wherein the master latch includes a hardened latch circuitry while the slave latch does not include a hardened latch circuitry, wherein the hardened latch circuitry comprises:
an inverter coupled to a pass-gate, wherein an input of the inverter is coupled to the pass-gate; and
a tristatable inverter having an input coupled to an output of the inverter, wherein the tristatable inverter includes:
a first transistor having a source terminal coupled to a power supply node and a gate terminal coupled to a clock input, and
a second transistor having a source terminal coupled to ground supply node and a gate terminal coupled to an inverse of the clock input;
a second pass-gate connected to the input and the output of the inverter, wherein the second pass-gate is of first conductivity type; and
a third pass-gate connected to the input and the output of the inverter, wherein the third pass-gate is of second conductivity type; and
a wireless interface to allow the processor to communicate with another device.

12. The system of claim 11, wherein the soft error tolerant flip-flop comprises an OR logic gate coupled to the master and slave latches, wherein the OR logic gate is to receive a clock and a stop clock enable, and wherein an output of the OR logic gate is provided as the clock input to the master and slave latches.

13. The system of claim 11, wherein the soft error tolerant flip-flop comprises an AND logic gate coupled to the master and slave latches, wherein the AND logic gate is to receive a clock and a stop clock enable, and wherein an output of the AND logic gate is provided as the clock input to the master and slave latches.

14. The system of claim 13, wherein the master latch is to store input data and the slave latch is to be in transparent operation mode when stop clock enable is activated.

15. The system of claim 13, wherein the stop clock enable is at least one clock cycle before a transition of the clock.

16. An apparatus comprising:
a circuitry to gate an input clock, and to provide a gated clock;
a master latch to receive the gated clock; and
a slave latch coupled to the master latch, wherein the slave latch is to receive the gated clock, and wherein the master latch comprises a hardened latch circuitry while the slave latch does not have a hardened latch circuitry, wherein the hardened latch circuitry comprises:
an inverter coupled to a pass-gate, wherein an input of the inverter is coupled to the pass-gate; and
a tristatable inverter having an input coupled to an output of the inverter, wherein the tristatable inverter includes:
a first transistor having a source terminal coupled to a power supply node and a gate terminal coupled to a gated clock input, and
a second transistor having a source terminal coupled to ground supply node and a gate terminal coupled to an inverse of the gated clock input;
a second pass-gate connected to the input and the output of the inverter, wherein the second pass-gate is of first conductivity type; and
a third pass-gate connected to the input and the output of the inverter, wherein the third pass-gate is of second conductivity type.

17. The apparatus of claim 16, wherein the circuitry includes an OR logic gate coupled to the master and slave latches, wherein the OR logic gate is to receive the input clock and a stop clock enable, and wherein an output of the OR logic gate is provided as the gated clock to the master and slave latches.

18. The apparatus of claim 16 wherein the circuitry includes an AND logic gate coupled to the master and slave latches, wherein the AND logic gate is to receive the input clock and a stop clock enable, and wherein an output of the AND logic gate is provided as the gated clock to the master and slave latches.

19. The apparatus of claim 16, wherein the master latch is to store input data and the slave latch is to be in transparent operation mode when stop clock enable is activated, and wherein the stop clock enable is at least one clock cycle before a transition of the clock.

20. An apparatus comprising:
a circuitry to gate an input clock, and to provide a gated clock;
a master latch to receive the gated clock; and
a slave latch coupled to the master latch, wherein the slave latch is to receive the gated clock, and wherein the master latch comprises a hardened latch circuitry while the slave latch does not have a hardened latch circuitry, wherein the hardened latch circuitry comprises:
an inverter coupled to a pass-gate, wherein an input of the inverter is coupled to the pass-gate;
a tristatable inverter having an input coupled to an output of the inverter, wherein the tristatable inverter includes:
a first transistor having a source terminal coupled to a first supply rail and a gate terminal coupled to a clock input; and
a second transistor having a source terminal coupled to a second supply rail and a gate terminal coupled to an inverse of the clock input;
a p-type transistor coupled to the input and the output of the inverter, wherein the p-type transistor has a gate terminal coupled to the first supply rail; and
an n-type transistor coupled to the input and the output of the inverter, wherein the n-type transistor has a gate terminal coupled to the second supply rail.

21. The apparatus of claim 20, wherein the p-type transistor is a first p-type transistor, wherein the n-type transistor is a first n-type transistor, wherein the hardened latch circuitry comprises:

a first p-type transistor coupled to the input and the output of the inverter, wherein the first p-type transistor has a gate terminal coupled to the first supply rail; and a second n-type transistor coupled to the input and the output of the inverter, wherein the second n-type transistor has a gate terminal coupled to the second supply rail.

22. The apparatus of claim 20, wherein the tristatable inverter includes:

a third transistor coupled in series with the first transistor, wherein a gate of the third transistor is coupled to the output of the inverter; and a fourth transistor coupled in series with the third transistor and the second transistor, wherein a gate of the fourth transistor is coupled to the output of the inverter.

23. The apparatus of claim 20, wherein the first supply rail is a positive power supply rail, wherein the second supply rail is a ground supply rail.

24. The apparatus of claim 20, wherein the master latch is to store input data and the slave latch is to be in transparent operation mode when a stop clock enable is activated, and wherein the stop clock enable is at least one clock cycle before a transition of the clock.

\* \* \* \* \*